US007019595B1

(12) United States Patent
Lo et al.

(10) Patent No.: US 7,019,595 B1
(45) Date of Patent: Mar. 28, 2006

(54) FREQUENCY SYNTHESIZER WITH AUTOMATIC TUNING CONTROL TO INCREASE TUNING RANGE

(75) Inventors: Chung When Lo, Palo Alto, CA (US); Keng Leung Fung, Sunnyvale, CA (US)

(73) Assignee: Ralink Technology, Inc., Cupertino, CA (US)

( * ) Notice: Subject to any disclaimer, the term of this patent is extended or adjusted under 35 U.S.C. 154(b) by 81 days.

(21) Appl. No.: 10/681,517

(22) Filed: Oct. 7, 2003

Related U.S. Application Data

(60) Provisional application No. 60/421,204, filed on Oct. 25, 2002.

(51) Int. Cl.
*H03L 7/00* (2006.01)

(52) U.S. Cl. .......................... 331/16; 331/11; 327/148; 327/157

(58) Field of Classification Search ............ 331/16–18, 331/10, 11, 1 A, 25, DIG. 2; 327/147, 148, 327/150, 156, 157, 159, 162, 163; 375/373–376
See application file for complete search history.

(56) References Cited

U.S. PATENT DOCUMENTS 4,272,729 A * 6/1981 Riley, Jr. .................... 331/1 A
4,590,602 A * 5/1986 Wolaver ..................... 375/375
5,363,419 A * 11/1994 Ho ............................ 375/376
5,375,148 A * 12/1994 Parker et al. ............... 375/376
5,379,002 A * 1/1995 Jokura ......................... 331/10
5,696,468 A * 12/1997 Nise ........................... 331/14
6,163,684 A * 12/2000 Birleson .................. 455/182.3
6,380,810 B1 * 4/2002 Sutton ......................... 331/17
6,483,390 B1 * 11/2002 Welland .................. 331/36 C
6,545,547 B1 * 4/2003 Fridi et al. .................... 331/16
6,566,966 B1 * 5/2003 Bellaouar et al. ............. 331/10
6,597,249 B1 * 7/2003 Chien et al. ............ 331/117 R
6,710,664 B1 * 3/2004 Humphreys et al. .......... 331/11

* cited by examiner

*Primary Examiner*—Timothy P. Callahan
*Assistant Examiner*—Hai L. Nguyen
(74) *Attorney, Agent, or Firm*—Law Offices of Imam

(57) ABSTRACT

A phase control loop circuit for tuning to a reference signal having a phase lock loop (PLL) circuit being responsive to a reference frequency signal having a reference frequency, said PLL circuit including a voltage control oscillator (VCO) for generating a VCO output, said PLL circuit for generating a PLL output, said phase control loop circuit processing said VCO output to generate an output frequency signal having an output frequency, in accordance with an embodiment of the present invention. The phase control loop circuit further includes a coarse tuning circuit being coupled to said PLL circuit, said coarse tuning circuit being responsive to said PLL output for processing the same to generate a counter output, said VCO being responsive to said counter output, said counter output for coarse tuning said output frequency signal to said reference frequency signal, said coarse tuning circuit further responsive to a lock detection (LD) signal, said LD signal for controlling said counter output to cause said output frequency to be within a predetermined range of frequencies including said reference frequency, said PLL circuit for fine tuning said output frequency signal to said reference frequency signal, wherein said PLL circuit and said coarse tuning circuit tune the output frequency to a reference frequency included in a wide range of frequencies.

20 Claims, 4 Drawing Sheets

FREQUENCY SYNTHESIZER WITH AUTOMATIC TUNING CONTROL TO INCREASE TUNING RANGE

REFERENCE TO PRIOR APPLICATION

This application claims the benefit of a previously filed U.S. Provisional Application No. 60/421,204 filed on Oct. 25, 2002, and entitled "FREQUENCY SYNTHESIZER WITH AUTOMATIC TUNING CONTROL TO INCREASE TUNING RANGE".

BACKGROUNG OF THE INVENTION

1. Field of the Invention

The present invention relates generally to the field of wireless reception and transmission of data and particularly to a method and apparatus for increasing the tuning range of frequency synthesizers used in wireless reception of data.

2. Description of the Prior Art

It is a well-known problem for receivers, such as cellular or mobile phones, or other such receivers, to have problems receiving signals correctly when a wide tuning range is utilized. For example, currently, to allow cellular phone receivers to receive signals in the range of 25 MHz, actually a 50 MHz-range must be covered. This requires an increase in the oscillator range utilized by the receiver and unfortunately, the wider the oscillator range, the more difficult it is to sufficiently lock to various frequencies in order to receive and decode signals accurately.

Additionally, during manufacturing of receivers, a problem that occurs is process variations. That is, due to variations in developing the components of an oscillator, such as in inductors and capacitors, the overall frequency range or performance of the oscillator is adversely affected.

FIG. 1 shows a prior art example of the components generally employed in the manufacturing of an oscillator 10. In FIG. 1, an oscillator 10 is shown to include an inductor 12 having an inductance L connected to a capacitor 14 with variable capacitance C. The active components included in the oscillator 10 are two bipolar transistors (Q) 15 and a current source (I) 17, which provide positive feedback for oscillation. The frequency of the oscillator is generally determined by the value of L and C. The inductance L typically remains constant or fixed, whereas, the value of C is changed to create a variable capacitor for effecting locking onto a range of frequencies.

In FIG. 2, an alternative structure to the capacitor 14 of FIG. 1 is shown that is consistent with prior art designs of the oscillator 10. More specifically, a capacitor array 16 replaces the capacitor 14 of FIG. 1 to include capacitors 18–22, which are fixed in value and connected in parallel to each other and to a variable capacitor 24. The variable capacitor 24 is used for fine tuning to a frequency to which the oscillator 10 is to lock thereto, whereas, the capacitors 18–22 are used for coarse tuning to the frequencies to be locked thereto. Each of the capacitors 18–22 can be switched 'on' or 'off' to achieve lock onto a particular frequency. The capacitors 18–22 need not be the same value and can be of different values and can even be of variable nature in order to fit the needs of various applications.

The capacitor 24 undergoes analog tuning while the capacitors 18–22 undergo digital tuning in that their capacitor values are programmably set. The values of capacitors 18–24 determine the range of frequencies to which the oscillator 10 successfully locks thereto.

To account for process variations during the manufacturing of the oscillator 10, the capacitors 18–24 are designed to cover a much larger range than necessary to ensure proper tuning of the oscillator during operation. To use the example above, for a cellular signal having a frequency range of 25 MHz, a 50 MHz frequency range is designed thereto to compensate for processing variations. Processing variations cause a wide tolerance of capacitor values, thus, disallowing reliance on precise capacitor values thereby affecting overall performance of the oscillator.

In light of the foregoing, it is desirable to develop an oscillator for use by a receiver for tuning into an increased range of frequencies, despite process variations during manufacturing of the oscillator, for accurate reception of received data and additionally avoiding a need for designing for a wider than necessary range of frequencies thereby reducing costs of manufacturing the receiver.

SUMMARY OF THE INVENTION

Briefly, an embodiment of the present invention includes a phase control loop circuit for tuning to a reference frequency signal having a phase lock loop (PLL) circuit being responsive to a reference frequency signal having a reference frequency, said PLL circuit including a voltage control oscillator (VCO) for generating a VCO output, said PLL circuit for generating a PLL output, said phase control loop circuit processing said VCO output to generate an output frequency signal having an output frequency. The phase control loop circuit further includes a coarse tuning circuit being coupled to said PLL circuit, said coarse tuning circuit being responsive to said PLL output for processing the same to generate a counter output, said VCO being responsive to said counter output, said counter output being used for coarse tuning said output frequency signal to said reference frequency signal, said coarse tuning circuit further responsive to a lock detection (LD) signal, said LD signal for controlling said counter output to cause said output frequency to be within a predetermined range of frequencies including said reference frequency, said PLL circuit for fine tuning said output frequency signal to said reference frequency signal, wherein said PLL circuit and said coarse tuning circuit tune the output frequency to a reference frequency included in a wide range of frequencies.

The foregoing and other objects, features and advantages of the present invention will be apparent from the following detailed description of the preferred embodiments which make reference to several figures of the drawing.

IN THE DRAWINGS

DETAILED DESCRIPTION OF THE PREFERRED EMBODIMENTS

Figure 1:
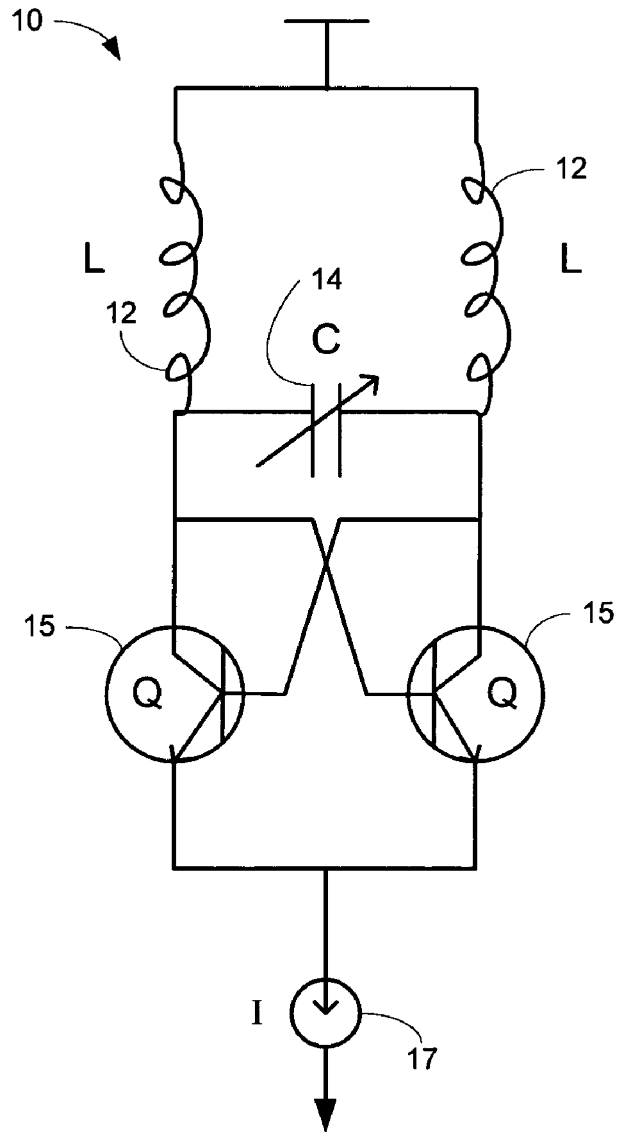
FIG. 1 shows a prior art example of the components generally employed in the manufacturing of an oscillator 10.
Figure 3:
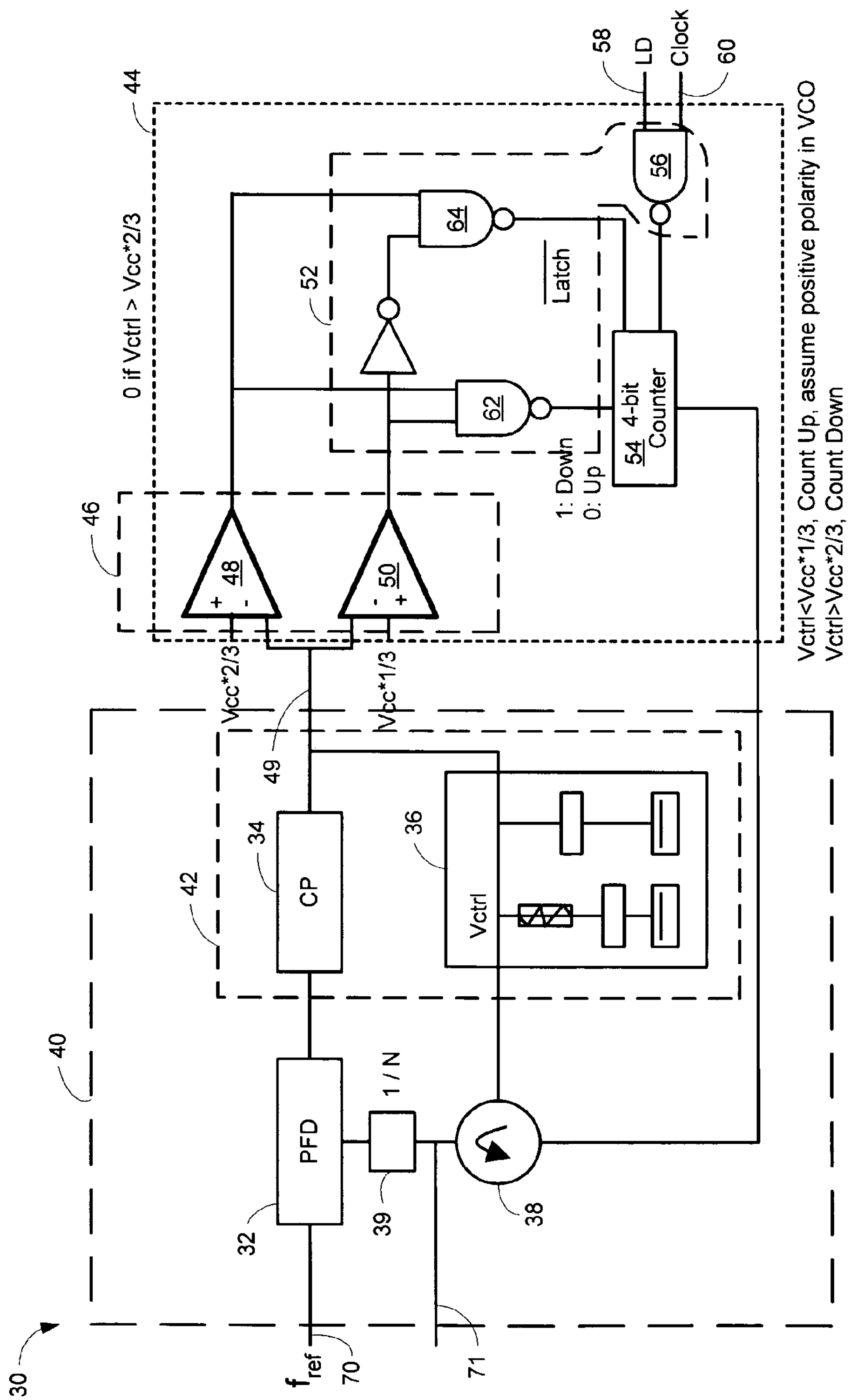
FIG. 3 shows a phase control loop circuit 30 in accordance with an embodiment of the present invention.

Referring now to FIG. 3, a phase control loop circuit 30 is shown, in accordance with an embodiment of the present invention, to include a phase-frequency detector (PFD)

circuit 32, a charge pump circuit 34, a loop filter 36 and a voltage control oscillator (VCO) 38 to form a phase lock loop (PLL) circuit 40. Here the previously described oscillator 10 of FIG. 1 functions as the VCO 38. The charge pump circuit 34 and the loop filter 36 comprise a fine tuning circuit 42.

In FIG. 3, the phase lock loop (PLL) circuit 40 is shown to receive a reference frequency ($f_{ref}$) signal 70 having a reference frequency as its input. The reference frequency of the reference frequency signal 70, is the desired frequency to be tuned to by the circuit 30. The range of frequencies of the signal 70 is wide. The signal 70 is received by the PFD circuit 32, which is shown coupled to the circuit 34, which is in turn shown coupled to the loop filter 36. The loop filter 36 is shown coupled to the VCO 38 and the output of the VCO 38 is shown coupled to a divider circuit 39, which is coupled to the PFD circuit 32. The circuit 39 divides the VCO output 71 by a factor of 'N', 'N' being an integer.

The circuit 30 is further shown to include a coarse tuning circuit 44 including a comparator circuit 46, a counter 54 and a counter control circuit 52. The coarse tuning circuit 44 is shown coupled to the phase lock loop circuit and specifically, to the PLL output 49. The comparator circuit 46 is shown coupled to the counter control circuit 52, which is shown coupled to the counter 54.

The comparator circuit 46 is shown to include a first comparator 48 and a second comparator 50 both of which provide outputs to the counter control circuit 52. The comparator 48 is shown to receive the PLL output 49 and an additional first fixed value signal having a first value voltage, an example of which is $V_{cc}$*⅔ (or two-thirds of the voltage level of $V_{cc}$) with $V_{cc}$ being a predetermined voltage value, which is generally an input voltage provided to the receiver in which the circuit 30 is employed. The comparator 50 is shown to have two inputs, one being the PLL output 49 and the other being a second fixed value signal having a second voltage value, such as $V_{cc}$*⅓, or one-third of the voltage level of $V_{cc}$.

The circuit 52 is shown to include a first nand gate 62 and a second nand gate 64 for receiving outputs from both of the comparators 50 and 48. The first comparator 48 generates a first comparator output and the second comparator 50 generates a second comparator output. The second nand gate 64 receives an inverted version of the second comparator output. The output of the nand gates 62 and 64 are provided as input to the counter 54. Another input to the counter 54 is provided by a third nand gate 56, which receives, as input, the 'LD' or lock detection signal 58 and the clock signal 60. While the circuits of the embodiment of the present invention, as shown in FIG. 3, are depicted in detail form, it should be understood to those of ordinary skill in the art that they may be implemented in ways or by structures different than those shown in FIG. 3. For example, the nand gates 56, 62 and 64 need not be nand gates and the comparators 48 and 50 may be other than those shown in the comparator circuit 46 and so forth.

The output of the nand gate 62 determines whether the counter 54 should count up or down and the output of the nand gate 64 determines whether or not the counter value should be latched or locked thereto. The clock signal 60 provides the clock to the counter 54 wherein at each clock cycle, the counter either counts up or down by one. The 'LD' signal 58 determines whether or not the counter 54 should keep counting or be halted. That is, when a desired frequency, such as $f_{ref}$ is locked thereto by the circuit 30, the counter 54 is halted because the LD signal 58 overrides the clock signal 60 by effectively shutting down so as to stop the counter 54 from counting. At this point, the value of the output of the counter 54, referred to herein as the counter output, is maintained latched thereto, as determined by the output of the nand gate 64 because the desired frequency, $f_{ref}$, is achieved. When the frequency at which the circuit 30 is operating is out of range, the counter resumes counting automatically because the LD signal 58 allows the clock signal 60 to provide clocking to the counter 54.

The locking function provided by the signal 58 to the counter 54, as described above, prevents jitter generated from the comparator circuit 46 to affect the phase lock loop circuit 40, which is essentially an analog circuit susceptible to jitter effects. Jitter is generally generated when the comparator circuit 46 performs a comparison.

The counter 54 is a four-bit counter but in alternative embodiments, the counter may be any number of bits. The number of bits determines the range of frequencies that the coarse tuning circuit 44 and ultimately the circuit 30 are capable of locking or tuning thereto. The counter output is provided as one of the inputs of the VCO 38 for stepping to any of the frequencies in the range of frequencies to be tuned thereto, in coarse tuning, whereas the voltage, $V_{ctrl}$, of the loop filter 36 provides another input to the VCO 38 for fine tuning.

The coarse tuning circuit 44 operates between the voltages $V_{cc}$*⅔ and $V_{cc}$*⅓ but again, this is merely an example of the range of the circuit 44 and can be easily altered to accommodate other design requirements. In the embodiment of FIG. 3, the comparator 48 compares the $V_{ctrl}$ to $V_{cc}$*⅔ and generates an output indicating whether or not the $V_{ctrl}$ is above or below the $V_{cc}$*⅔ voltage level, which is then provided to the nand gates 62 and 64. Similarly, the comparator 50 compares the $V_{ctrl}$ to $V_{cc}$*⅓ and generates an output indicating whether or not the $V_{ctrl}$ is above or below the $V_{cc}$*⅓ voltage level, which is then provided to the nand gates 62 and the inverted version is provided to the nand gate 64. When $V_{ctrl}$ is less than $V_{cc}$*⅓, the counter 54 counts up, assuming positive polarity of the VCO 38 and when $V_{ctrl}$ is greater than $V_{cc}$*⅔, the couter 54 counts down.

When $V_{ctrl}$ is greater than $V_{cc}$*⅓ but less than $V_{cc}$*⅔ the corresponding output frequency is said to be within a predetermined range of frequencies, which includes the reference frequency. When the output frequency is out of the predetermined range of frequencies the counter 54 resumes counting and when the output frequency is within the predetermined range of frequencies the counter output is maintained.

Figure 2:
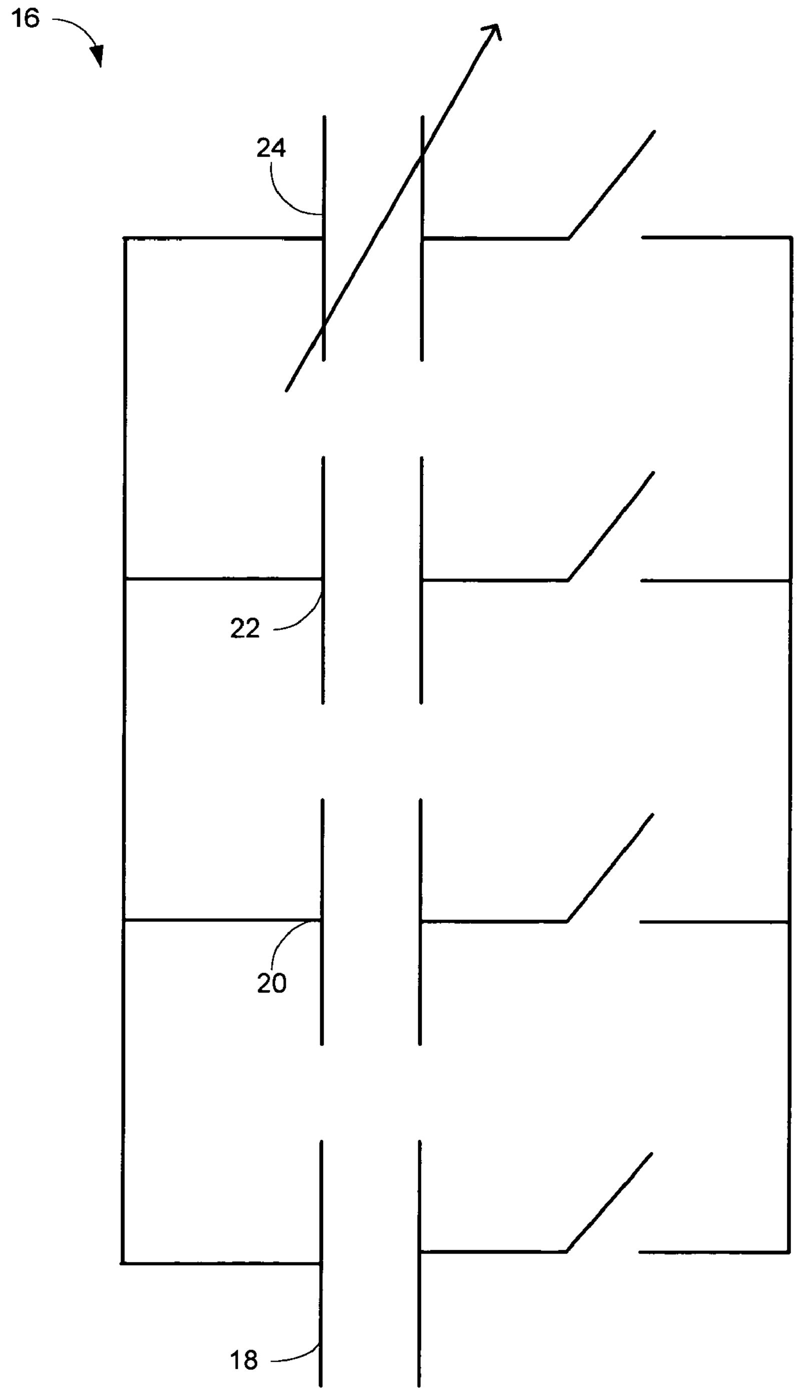
FIG. 2 shows an alternative structure to the capacitor 14 of FIG. 1 that is consistent with prior art designs of the oscillator 10.

Thus, the coarse tuning circuit 44 performs digital tuning and basically implements the coarse tuning function performed by the capacitors 18–22 of FIG. 2 and the fine tuning circuit 42 performs the analog or fine tuning of the variable capacitor 24 of FIG. 2. The effect of turning on additional capacitors in FIG. 2 is accomplished by the counter 54 counting up to provide additional voltage to the VCO 38, in FIG. 3, and the effect of reducing the number of capacitors in FIG. 2 is accomplished by counting down in FIG. 3. However, in comparison to the structure of FIG. 2, the embodiment of FIG. 3 provides an increased range of frequencies that can be locked or tuned thereto and done so automatically to compensate for the process variations experienced during manufacturing of the receiver in which the circuit 30 is employed.

The loop filter 36 is a generic filter comprised of passive elements, such as capacitors and resistors for filtering undesired frequencies generated by noise from entering the VCO 38 and potentially adversely affecting tuning into a desired frequency.

The PFD circuit 32 is a phase detector, comparing two frequencies, one frequency being the reference frequency of the $f_{ref}$ signal 70 and the other frequency being the frequency of the output of the circuit 39, referred to herein as the output frequency, to make sure that these two frequencies are locked. The output of the circuit 39 is referred to herein as the output frequency signal. If there is any difference between these two frequencies, it is apparent at the PFD output generated by the PFD circuit 32. The PFD output includes a Δf signal, which is essentially the difference, in frequency, between the output frequency and the reference frequency of the $f_{ref}$ signal 70. The charge pump circuit 34 generates a current based on the value of the Δf signal. The current generated at the output of the circuit 34 is converted to a voltage value, referred to herein as $V_{ctrl}$, by the loop filter 36, which is then included in the PLL output 49 and provided to the coarse tuning circuit 44. Thus, the Δf signal controls the direction of the counter 54 and voltage to the VCO 38 and ultimately, the coarse tuning circuit 44 adjusts the voltage of the VCO 38 to obtain lock to the desired reference frequency.

The counter 54 and remaining circuits of the circuit 44 allow automatic tuning control. When fine tuning of the fine tuning circuit 42 runs out of range, the coarse tuning circuit 44 takes over to bring the frequency somewhere within range of the desired frequency and then with the use of the fine tuning circuit 42, locking to the desired frequency is achieved.

The phase control loop circuit 30 allows the phase of the reference frequency signal to be essentially the same as the phase of the output frequency signal.

Theoretically, there is no limit on the range of frequency to which the circuit 30 of FIG. 3 can lock thereto. Practically, due to phase noise and the perhaps less than desired gain of the VCO 38, there may be limitations placed on the range although the embodiment of FIG. 3 allows for an increase in the tuning range of a receiver in which it is used as compared to prior art circuits. It is the inventors' experience that in one embodiment of the present invention, the tuning range was extended from 8 to 30% although the latter value would be even higher with more digital switch stages.

The LD signal 58 disables or halts the coarse tuning circuit 44 once lock is achieved to ensure that no noise or interference, generated by the internal circuits of the circuit 44, is experienced by the fine tuning circuit 40 or overall circuit 30. When the output frequency at which the circuit 30 is operating is out of the predetermined range of frequencies, the counter resumes counting because the LD signal 58 allows the clock signal 60 to provide clocking to the counter 54 automatically.

The phase control loop circuit 30 tunes the output frequency to the reference frequency on-the-fly.

Figure 4:
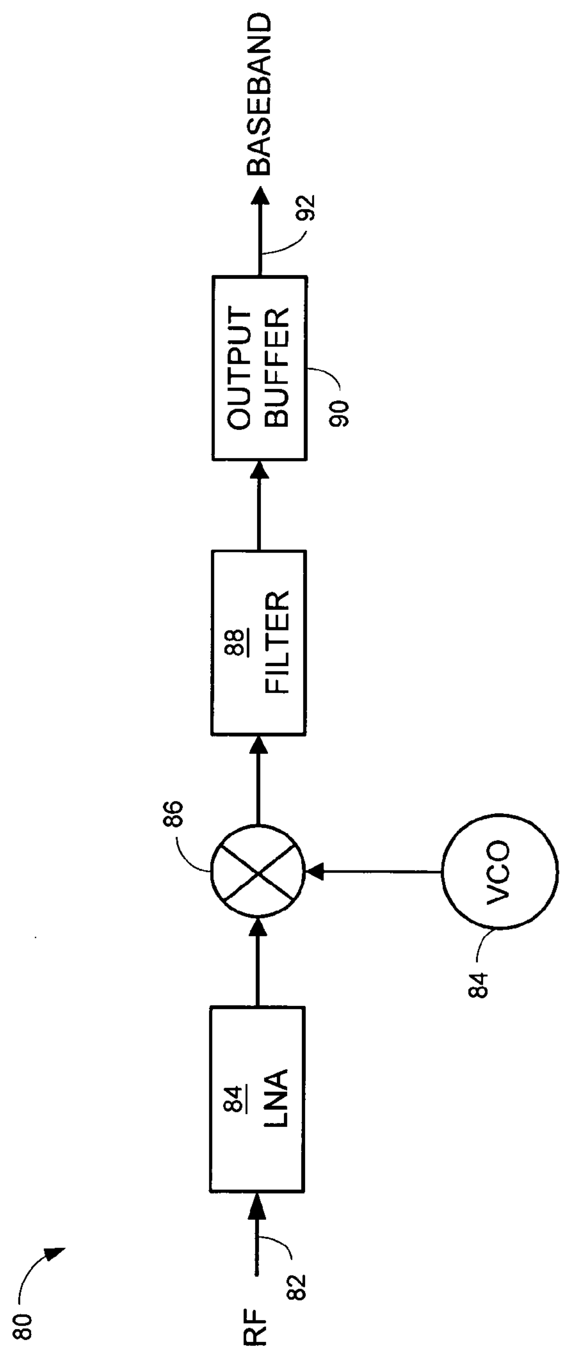
FIG. 4 shows an example of an application of the embodiment of FIG. 3.

FIG. 4 shows an example of an application of the embodiment of FIG. 3. In FIG. 4, a receiver 80 is shown to include a low noise amplifier 84 for receiving a radio frequency (RF) signal 82 and amplifying the same for output to a mixer 86, which receives another input from the VCO 84 to convert the RF signal 82 to baseband. The output of the mixer 86 is provided to the filter 88 where it is filtered and the output of the filter 88 is provided to the output buffer 90 for providing a baseband signal 92. The VCO 84 is basically included in the circuit 30 of FIG. 3.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A phase control loop circuit for tuning to a reference frequency signal comprising:

a phase lock loop (PLL) circuit being responsive to a reference frequency signal having a reference frequency, said PLL circuit including a voltage control oscillator (VCO) for generating a VCO output, said PLL circuit for generating a PLL output, said phase control loop circuit processing said VCO output to generate an output frequency signal having an output frequency; and a coarse tuning circuit being coupled to said PLL circuit, said coarse tuning circuit being responsive to said PLL output for processing the same to generate a counter output, said VCO being responsive to said counter output, said counter output being used for coarse tuning said output frequency signal to said reference frequency signal, said coarse tuning circuit further responsive to a lock detection (LD) signal, said LD signal for controlling said counter output to cause said output frequency to be within a predetermined range of frequencies including said reference frequency, said PLL circuit for fine tuning said output frequency signal to said reference frequency signal, wherein said PLL circuit and said coarse tuning circuit tune the output frequency to the reference frequency included in a wide range of frequencies further wherein said PLL circuit includes a phase-frequency detector (PFD) circuit for comparing said output frequency with said reference frequency to generate a PFD output, said PFD output including a Δf signal for representing the difference between said output frequency and said reference frequency, said PLL circuit further including a charge pump (CP) circuit responsive to said PFD output for generating a current, the value of said current being based on the value of said Δf signal, wherein said PLL circuit further includes a loop filter responsive to said current for converting the same to generate a control voltage ($V_{ctrl}$) signal having a voltage value $V_{ctrl}$, said $V_{ctrl}$ signal being provided to said VCO to control said VCO output, said $V_{ctrl}$ signal controlling said VCO output to enable said PLL circuit to fine tune said output frequency to said reference frequency, further wherein said coarse tuning circuit includes a comparator circuit, said comparator circuit including a first comparator and a second comparator, said $V_{ctrl}$ signal being included in said PLL output, said first and second comparators being responsive to said PLL output, said first comparator being responsive to a first fixed value signal having a first voltage value, said second comparator being responsive to a second fixed value signal having a second voltage value.

2. A phase control loop circuit as recited in claim 1 wherein said PLL circuit and said coarse tuning circuit cause said output frequency signal to have essentially the same phase as said reference frequency signal.

3. A phase control loop circuit as recited in claim 1 wherein said PLL circuit and said coarse tuning circuit tune said output frequency to said reference frequency on-the-fly.

4. A phase control loop circuit as recited in claim 1 responsive to radio frequency (RF) signals for use in generating amplified RF signals for use by a mixer for converting said amplified RF signals to baseband signals.

5. A phase control loop circuit as recited in claim 4 for tuning to said reference frequency included in a wide range of frequencies to compensate for the process variations caused by manufacturing said receiver.

6. A phase control loop circuit as recited in claim 1 further including a divider circuit responsive to said VCO output for dividing the same by a factor N to generate said output frequency signal.

7. A phase control loop circuit as recited in claim 1 wherein said first voltage value is two thirds of a predetermined voltage value ($V_{cc}$), said second voltage value is one third of said $V_{cc}$.

8. A phase control loop circuit as recited in claim 7 wherein said first comparator for comparing said $V_{ctrl}$ to said first voltage value, said second comparator for comparing said $V_{ctrl}$ to said second voltage value, said first comparator for generating a first comparator output and said second comparator for generating a second comparator output.

9. A phase control loop circuit as recited in claim 8 wherein said VCO has a positive polarity, said $V_{ctrl}$ being less than said second voltage value causes said counter to count up to increase said counter output, said $V_{ctrl}$ being greater than said first voltage value causes said counter to count down to decrease said counter output, said $V_{ctrl}$ being greater than said second voltage value and less than said first voltage value causes said second counter to stop counting and maintain said counter output, said $V_{ctrl}$ being greater than said second voltage value and less than said first voltage value causes said output frequency to be within said predetermined range of frequencies.

10. A phase control loop circuit as recited in claim 8 wherein said coarse tuning circuit further includes a counter control circuit, said counter control circuit including a first nand gate and a second nand gate responsive to said first comparator output, said first nand gate being responsive to said second comparator output, said second nand gate being responsive to an inverted version of said second comparator output.

11. A phase control loop circuit as recited in claim 10 wherein said coarse tuning circuit further includes a counter for generating a counter output, the output of said first nand gate causes said counter to count, the output of said second nand gate causes said counter output to be maintained.

12. A phase loop control circuit as recited in claim 11 wherein said counter is a 4-bit counter, said counter enabling said phase control loop circuit to tune said output frequency to said reference frequency included in an increased range of frequencies.

13. A phase control loop circuit as recited in claim 11 wherein said counter being responsive to the output of a third nand gate, said third nand gate being responsive to a lock detection (LD) signal and a clock signal, said clock signal provides clock cycles to said counter wherein at each said clock cycle said counter begins to count, said LD signal for overriding said clock signal to halt the counting performed by said counter.

14. A phase control loop circuit as recited in claim 13 wherein said PLL circuit is essentially an analog circuit, said LD signal for preventing jitter generated by said comparator circuit to affect said PLL circuit.

15. A phase control loop circuit for tuning to a reference frequency signal comprising:

a phase lock loop (PLL) circuit being responsive to a reference frequency signal having a reference frequency, said PLL circuit including a voltage control oscillator (VCO) for generating a VCO output, said PLL circuit for generating a PLL output, said phase control loop circuit processing said VCO output to generate an output frequency signal having an output frequency; and a coarse tuning circuit being coupled to said PLL circuit, said coarse tuning circuit being responsive to said PLL output for processing the same to generate a counter output, said VCO being responsive to said counter output, said counter output being used for coarse tuning said output frequency signal to said reference frequency signal, said coarse tuning circuit including a first comparator responsive to the PLL output and to a first voltage level and including a second comparator responsive to the PLL output and to a second voltage level, the first and second voltage level defining a predetermined voltage range, said first comparator comparing the PLL output to the first voltage level generating a first comparator output, said second comparator comparing the PLL output to the second voltage level generating a second comparator output, said course tuning circuit further including a counter responsive to the first and second comparator outputs for use by the PLL causing said output frequency to be within a predetermined range of frequencies including said reference frequency by the counter stepping up or down based upon the first and second outputs to adjust the PLL output to be within the predetermined voltage range, said PLL circuit for fine tuning said output frequency signal to said reference frequency signal, wherein said PLL circuit and said coarse tuning circuit tune the output frequency to the reference frequency included in a wide range of frequencies.

16. A phase control loop circuit as recited in claim 15 wherein said PLL circuit includes a phase-frequency detector (PFD) circuit for comparing said output frequency with said reference frequency to generate a PFD output, said PFD output including a $\Delta f$ signal for representing the difference between said output frequency and said reference frequency.

17. A phase control loop circuit as recited in claim 16 wherein said PLL circuit further includes a charge pump (CP) circuit responsive to said PFD output for generating a current, the value of said current being based on the value of said $\Delta f$ signal.

18. A phase control loop circuit as recited in claim 17 wherein said PLL circuit further includes a loop filter responsive to said current for converting the same to generate a control voltage ($V_{ctrl}$) signal having a voltage value $V_{ctrl}$, said $V_{ctrl}$ signal being provided to said VCO to control said VCO output, said $V_{ctrl}$ signal controlling said VCO output to enable said PLL circuit to fine tune said output frequency to said reference frequency.

19. A method for tuning to a reference frequency signal comprising:

receiving the reference frequency signal having a reference frequency;

generating a voltage control oscillator (VCO) output;

generating a phase lock loop (PLL) output;

processing the VCO output to generate an output frequency signal having an output frequency;

processing the PLL output to generate a counter output;

comparing the PLL output to a first voltage level and a second voltage level;

generating a voltage output based upon the compared PLL output, the voltage output having a voltage level being within a predetermined voltage range;

coarse tuning the output frequency signal to the reference frequency signal based upon the voltage range;

receiving a lock detection (LD) signal;

controlling the counter output to cause the output frequency to be within a predetermined range of frequencies; and fine tuning the output frequency signal to the reference frequency signal, wherein the output frequency is tuned to the reference frequency included in a wide range of frequencies.

20. A phase control loop circuit for tuning to a reference frequency signal comprising:

means for receiving the reference frequency signal having a reference frequency;

means for generating a voltage control oscillator (VCO) output;

means for generating a phase lock loop (PLL) output;

means for processing the VCO output to generate an output frequency signal having an output frequency;

means for processing the PLL output to generate a counter output;

means for coarse tuning the output frequency signal to the reference frequency signal;

means for receiving a lock detection (LD) signal; and means for controlling the counter output to cause the output frequency to be within a predetermined range of frequencies; and means for fine tuning the output frequency signal to the reference frequency signal, wherein the output frequency is tuned to the reference frequency included in a wide range of frequencies further including a phase-frequency detector (PFD) circuit for comparing said output frequency with said reference frequency to generate a PFD output, said PFD output including a Δf signal for representing the difference between said output frequency and said reference frequency, said PLL circuit further including a charge pump (CP) circuit responsive to said PFD output for generating a current, the value of said current being based on the value of said Δf signal, wherein said PLL circuit further includes a loop filter responsive to said current for converting the same to generate a control voltage ($V_{ctrl}$) signal having a voltage value $V_{ctrl}$, said $V_{ctrl}$ signal being provided to said VCO to control said VCO output, said $V_{ctrl}$ signal controlling said VCO output to enable said PLL circuit to fine tune said output frequency to said reference frequency, further wherein said coarse tuning circuit includes a comparator circuit, said comparator circuit including a first comparator and a second comparator, said $V_{ctrl}$ signal being included in said PLL output, said first and second comparators being responsive to said PLL output, said first comparator being responsive to a first fixed value signal having a first voltage value, said second comparator being responsive to a second fixed value signal having a second voltage value.

* * * * *